00
United States Patent [19]

Pampalone

[11] 4,341,861
[45] Jul. 27, 1982

[54] AQUEOUS DEVELOPABLE POLY(OLEFIN SULFONE) TERPOLYMERS

[75] Inventor: Thomas R. Pampalone, Belle Mead, N.J.

[73] Assignee: RCA Corporation, New York, N.Y.

[21] Appl. No.: 219,517

[22] Filed: Dec. 23, 1980

[51] Int. Cl.³ .............................................. G03F 7/10
[52] U.S. Cl. .................................. 430/296; 430/329; 430/311
[58] Field of Search ............... 430/281, 286, 296, 942, 430/329, 311; 427/43.1

[56] References Cited

U.S. PATENT DOCUMENTS 3,898,350  8/1975  Gipstein et al. ..................... 427/43

*Primary Examiner*—John D. Welsh
*Attorney, Agent, or Firm*—Birgit E. Morris; R. Hain Swope

[57] ABSTRACT

This invention relates to novel terpolymers of 3-methylcyclopentene, 2-cyclopentene-1-acetic acid and sulfur dioxide. Positive electron beam resist media prepared from the subject terpolymers possesses excellent sensitivity and development latitude and unexpectedly are developable with conventional aqueous alkaline developers.

8 Claims, No Drawings ative to small variations in environment if high yields are to be maintained and losses minimized. Again, as a general rule for all positive resists, increased sensitivity is realized at the expense of loss of developmental latitude and vice versa.

AQUEOUS DEVELOPABLE POLY(OLEFIN SULFONE) TERPOLYMERS

This invention relates to novel poly(olefin sulfone) terpolymers which are useful as aqueous developable positive resist recording media in the manufacture of electronic devices including microelectronic circuits.

BACKGROUND OF THE INVENTION

Positive acting electron beam resist media and the use thereof in forming patterned layers in and on a variety of substrates are well known in the art. Poly(olefin sulfone) polymers are a major class of such positive electron beam resists. For example, poly(1-methyl-1-cyclopentene sulfone) has been utilized for audio/video recording apparatus as described in Poliniak et al., U.S. Pat. Nos. 3,935,331 and 3,935,332.

Poly(olefin sulfone) terpolymers and their use as electron beam resists are likewise known in the art. For example, Gipstein et al. in U.S. Pat. No. 3,898,350 disclose terpolymers formed from (a) an alpha olefin; (b) sulfur dioxide and (c) a compound selected from the group consisting of cyclopentene, bicycloheptene and methyl methacrylate.

Heretofore, the vast majority of positive electron beam resists are developed with an organic developer. The few aqueous developable positive electron beam resists known to the art are not polymeric in nature. Such resists comprise a water-soluble alkali resin and an electron beam sensitive compound as described, for example, in Ross et al., U.S. Pat. No. 4,065,306.

Without exception, poly(olefin sulfone) copolymer and terpolymer positive electron beam resists are recognized in the art as being developable with an organic developer. It will be readily appreciated that the use of an organic developer is disadvantageous in terms of cost of materials as well as potential impact on the environment. Organic developers are further disadvantageous in that their action on the resist is, in essence, a physical one, i.e., the developer penetrates interstices in the exposed portion of the polymer and causes the resist to swell. As a result of this physical development, all organic solvent developers will cause cracking in the resist to some degree, particularly with thicker films. By contrast, an aqueous developer works by chemical reaction with the exposed portions of the resist, i.e., by forming soluble salts. Therefore, cracking is not usually a problem with aqueous developers.

Another problem inherent with all positive resists, regardless of the type of developer utilized, is development latitude. Since conditions such as development time, temperature, and humidity vary to a small degree, even in the most stringently controlled environments, the development of the resist should not be ultra-sensitive to small variations in environment if high yields are to be maintained and losses minimized. Again, as a general rule for all positive resists, increased sensitivity is realized at the expense of loss of developmental latitude and vice versa.

The aqueous developable electron beam resists of this invention are highly advantageous, particularly with reference to forming patterns in materials such as chromium, in that they possess a substantially improved development latitude without loss of sensitivity and utilize a developer which is both inexpensive and non-offensive to the environment. In addition, resists formed from the poly(olefin sulfone) terpolymers of this invention adhere well to the substrate, yield highly resolved patterns after development with little erosion, and are free from cracking and swelling even in films over one micrometer in thickness.

The present invention is predicated on the discovery that inclusion of a particular cyclic organic acid in a poly(olefin sulfone) terpolymer produces a material suitable for the preparation of positive electron beam resist media which are developable with an aqueous developer. Media utilizing the terpolymers of this invention have a significantly high degree of resolution without appreciable loss of any of the desirable characteristics normally associated with poly(olefin sulfone) electron beam resists such as, for example, adhesion to the substrate. An article by Hailer et al. in *J. Electrochem. Soc.*, January, 1979, p. 154–161, documents the art's awareness that incorporation of carboxylic acid groups into a resist material will improve adhesion of the resist to silicon, silicon dioxide and various metals utilizing a comparison between a polymethylmethacrylate/methacrylic acid polymer and a similar copolymer containing no methacrylic acid. Further, it has long been recognized in the printing industry that small amounts of carboxylic acid groups in binders improve adhesion of conventional photopolymers to aluminum and copper plates.

It is considered unexpected in the light of the above discussed teachings, that the novel terpolymers of this invention would possess the advantages conventionally associated with poly(olefin sulfone) electron beam resists and, in addition, be characterized by a significantly high degree of resolution and by being developable with an aqueous developer.

SUMMARY OF THE INVENTION

In accordance with this invention, there are provided novel poly(olefin sulfone) terpolymers suitable for the preparation of positive electron beam resist recording media. The terpolymers of this invention are characterized by being developable with an aqueous developer in contrast to known poly(olefin sulfone) polymers utilized for positive resist media.

DETAILED DESCRIPTION OF THE INVENTION

The aqueous developable poly(olefin sulfone) terpolymers provided in accordance with the present invention are terpolymers of 3-methylcyclopentene, 2-cyclopentene-1-acetic acid and sulfur dioxide. The terpolymers of this invention comprise the monomer component, i.e. 3-methylcyclopentene and 2-cyclopentene-1-acetic acid, and sulfur dioxide in a 1:1 molar ratio. The monomer component comprises from about 70 mole % to about 93 mole % 3-methylcyclopentene and from about 7 mol % to about 30 mole % 2-cyclopentene-1-acetic acid.

It has been found, in accordance with this invention, that reducing the content of 2-cyclopentene-1-acetic acid of the subject terpolymers substantially below about 7 mole % of the monomer component will result in insufficient water-soluble salt formation with the base of the aqueous developer to develop a resist pattern formed therefrom. Conversely, increasing the 2-cyclopentene-1-acetic substantially above about 30 mole % of the monomer component will decrease solubility of the terpolymer in the high boiling organic solvents utilized as casting solvents for resist films, thereby adversely affecting coating of a substrate with the casting solution. Therefore, it is preferred that the monomer component of the terpolymers of this invention contain from about 80 mole % to about 85 mole % 3-methylcyclopentene and from about 15 mole % to about 20 mole % 2-cyclopentene-1-acetic acid.

The poly(olefin sulfone) terpolymers of this invention can be prepared in a conventional manner by free radical polymerization of the monomer component and sulfur dioxide in the presence of a conventional polymerization initiator such as, for example, t-butylhydroperoxide. It is preferred to fractionate the subject terpolymers from a suitable media to thereby obtain a terpolymer of sufficiently high molecular weight and narrow molecular weight distribution so that a good quality film able to withstand conventional substrate etchants can be produced therefrom. In addition, the terpolymer film should develop cleanly in those areas exposed to electron beam while having less than about 10 percent erosion, i.e., thickness loss, in the unexposed areas. The molecular weight of the subject terpolymers is further important in terms of their solubility in the solvents used for casting such films. In general, the novel terpolymers of this invention have a weight average molecular weight ($M_w$), after fractionation, of from about 250,000 to about 1,000,000, preferably from about 500,000 to about 750,000, and a molecular weight distribution ($M_w/M_n$) of less than 4, wherein $M_n$ equals number average molecular weight.

In order to apply the terpolymers of this invention to a substrate, the terpolymer is initially dissolved in a suitable organic solvent. The resulting solution is then coated on the substrate in a conventional manner, e.g., by casting, spraying, spin coating and the like. The solution usually contains from about 4 percent by weight to about 10 percent by weight, preferably from about 6 percent by weight to about 8 percent by weight of the terpolymer. Suitable organic solvents preferably have low boiling points thus permitting ready removal of the solvent from the coating by heat and/or by vacuum drying. Removal of the solvent should form a uniform resist recording medium film of the terpolymer on the substrate. Examples of suitable solvents for the novel terpolymers of this invention include 2-methoxyethyl acetate and cyclopentanone. A preferred solvent, in accordance with this invention, is 2-methoxyethylacetate.

The recording medium films are formed on the substrate in various thicknesses, generally from about 0.1 micron to about 5 microns, depending on the intended use of the subject recording media. It is preferred to bake the film in air or under vacuum, usually at a temperature above the glass transition temperature of the terpolymer but below its thermal decomposition point.

Portions of the recording medium films of the terpolymers of this invention are selectively exposed to modulated electron beam irradiation thereby causing the terpolymer to degrade by chain scission in the exposed areas. The specific exposure flux will normally depend upon the thickness of the resist coating. Generally, for exposure of a film having a thickness from about 0.1 micron to about 5 microns, electron beam radiation from about 0.1 microcoulomb/cm$^2$ to about 5 microcoulomb/cm$^2$ is utilized. For preferred films having a thickness of between about 0.5 to about 1 micron, radiation of from about 0.4 microcoulomb/cm$^2$ to about 0.8 microcoulomb/cm$^2$ is employed.

When utilized as positive-working etch resists, films of the terpolymers of this invention are cast to a thickness equal to or less than the depth of penetration of the electron beam, thus exposing the substrate upon development. Alternatively, the terpolymers of this invention can be employed as media for recording of surface relief patterns by exposing thicker films to form well defined patterns which, upon development, correspond in relief to the information recorded.

Exposed films formed from the terpolymers of this invention are developed utilizing a conventional aqueous-alkaline developer. Typically, such developers are aqueous solutions of strong inorganic bases such as, for example, sodium hydroxide, usually in combination with additives such as buffering agents, organic wetting agents and the like. The aqueous developer may advantageously be combined with a minor amount, i.e., up to about 20 percent, of an organic solvent for the terpolymer, preferably the same solvent used to cast the film. The presence of the organic solvent in the developer aids in the removal of any portions of terpolymer in the exposed area which might not be solubilized by the aqueous developer, thus assuring complete removal of the exposed areas. While it will be appreciated that the organic solvent will dissolve or erode the unexposed areas of the terpolymer, the relative solubility of the exposed areas as compared to the unexposed areas of the aqueous developer is such that comparatively minor erosion of the unexposed areas takes place during removal, i.e., development, of the exposed areas. The combination of the two solvents assures both a full development and a more controlled development as is the case with conventional solvent/non-solvent combinations.

As stated above, one of the primary advantages of the terpolymers of this invention is an improved development latitude. The resist layers formed from the subject terpolymers may be developed for from about ½ to about 30 minutes, preferably for from about one to about ten minutes, and most preferably for from about one to about two minutes. In a like manner, the temperature at which the subject films are developed can vary within a rather wide range. Generally, however, temperatures from about 20° C. to about 30° C., preferably from about 23° C. to about 26° C., are contemplated.

The recording media of this invention may, after removal of the exposed portion, provide a pattern on the substrate which is used conventionally as a guide for the formation of circuits and the like. The substrates which may be advantageously so treated include, for example, plastic or a plastic laminate, porcelain-coated steel, ceramic wafers, chrome- or nickel-coated glass, and the like, on which it is desired to form a microelectronic circuit. Wherein portions of the surface of the substrate have been exposed, the desired pattern is formed therein by use of a conventional etchant therefore, e.g. ferric chloride solutions for steel, hydrofluoric acid solutions for glass and the like.

The following examples further illustrate this invention, it being understood that the invention is in no way intended to be limited to the details described therein. In the Examples, all parts and percentages are on a weight basis and all temperatures are in degrees Centigrade, unless otherwise stated.

EXAMPLES 1-5

Solutions totaling 10 ml of 3-methylcyclopentene and 2-cyclopentene-1-acetic acid in the proportions given in Table I below are individually mixed with 0.2 ml portions of 90 percent t-butylhydroperoxide. Each solution was added dropwise to agitated mixtures of 15 ml sulfur dioxide and 15 ml anhydrous ethanol at −30° under an inert atmosphere. The sulfur dioxide was then allowed to boil off and the residues each dissolved in 100 ml portions of tetrahydrofuran. Only the terpolymers of Examples 1 and 2 which contained less than 30 mole percent 2-cyclopentene-1-acetic acid were completely soluble in tetrahydrofuran and could be further processed.

The solutions of the terpolymers of Examples 1 and 2 were each poured slowly into 500 ml portions of methanol with agitation to precipitate the terpolymer product. The collected product in each instance was vacuum dried (yield approximately 80 percent) and fractionated by stirring for one hour in 1000 ml of a 1:1 mixture of methylene chloride and methanol. In each instance, the undissolved material settling to the bottom of the vessel was recovered by decanting the supernatant liquid. The product was dissolved in tetrahydrofuran and reprecipitated from agitated methanol in the manner described earlier. The yield of the fractionated material was approximately 60 percent. Fractionation typically (Example 2) increased the molecular weight ($M_w$) from about 500,000 to about 700,000 and decreased the molecular weight distribution ($M_w/M_n$) from 2.8 to 1.6. In Table I, 2-cyclopentene-1-acetic acid and 3-methylcyclopentene are designated "Acid" and "3-MCP," respectively.

TABLE I

| EXAMPLE NO. | ACID (ml) | 3-MCP (ml) | SOLUBILITY CHARACTERISTICS |
|---|---|---|---|
| 1 | 1.5 | 8.5 | Completely soluble in tetrahydrofuran (THF). |
| 2 | 2.0 | 8.0 | Completely soluble in THF. |
| 3 | 3.0 | 7.0 | Insoluble gel particles in THF. |
| 4 | 5.0 | 5.0 | Only partially soluble in THF. |
| 5 | 10.0 | 0 | Insoluble in THF and in dimethylformamide; soluble in sodium hydroxide. |

EXAMPLE 6

The fractionated terpolymer of Example 2 above was dissolved, approximately 6 percent by weight, in 2-methoxyethylacetate. The resulting solution was spin-coated on a chrome/glass substrate and dried to form a film 0.5 micrometer thick. For comparative purposes, a 0.5 micrometer thick film was formed on a similar substrate from a solution of a sample of a fractionated copolymer of 3-methylcyclopentene and sulfur dioxide in 2-methoxyethylacetate. Samples of films from each material were exposed to 0.8, 0.6, 0.4 and 0.3 microcoulomb/$cm^2$ doses, respectively, of modulated electron beam irradiation, through a mask consisting of 3 mm bars and spaces.

The terpolymer was developed utilizing Riston II Developer available from E. I. DuPont alone or in combination with varying quantities of 2-methoxyethylacetate. Riston II Developer is an aqueous solution of sodium hydroxide with an added buffer and an organic wetting agent. The copolymer was developed with an approximately equal mixture of 2-methylcyclohexanone and 2-methylcyclohexanol. Development latitude in terms of time and temperature were determined in each case by holding one constant and varying the other. An acceptably developed film was one which developed cleanly in exposed areas while suffering less than 10 percent erosion, i.e., thickness loss, is unexposed areas. The development latitude of both the terpolymer and the copolymer, along with the developer system utilized in each instance, are given in Table II.

TABLE II

| DEVELOPER | EXPOSURE ($\mu C/cm^2$) | DEVELOPMENT LATITUDE | |
|---|---|---|---|
| | | TIME (Min.) | TEMPERATURE |
| Copolymer: | | | |
| 2-methylcyclohexanone/ 2-methylcyclohexanol ≅ 1:1 | 0.8 | 1½ to 2 | 23° to 25° |
| | 0.6 | Not acceptably developed* | — |
| Terpolymer: | | | |
| 20 ml Riston II Developer | 0.8 | ½ to 30 | 35° to 42° |
| 20 ml Riston II Developer plus 5 ml 2-methoxyethylacetate | 0.8 | ½ to 30 | 23° to 30° |
| 20 ml Riston II Developer plus 5 ml 2-methoxyethylacetate | 0.6 | 1 to 6 | 23° to 28° |
| 20 ml Riston II Developer plus 8 ml 2-methoxyethylacetate | 0.4 | 1 to 2 | 23° to 25° |
| 20 ml Riston II Developer plus 8 ml 2-methoxyethylacetate | 0.3 | Not Acceptably developed* | — |

*Erosion of unexposed area was greater than 10% when exposed area fully developed.

The data in Table II clearly established that the terpolymer has significantly increased development latitude in comparison to the corresponding copolymer and twice the working sensitivity (0.4 $mC/cm^2$ as compared to 0.8 $\mu C/cm^2$).

EXAMPLE 7

The procedure of Example 6 was repeated utilizing the same coatings and developers but increasing the thickness of the film. For the copolymer, development for three minutes produced cracking in films greater than 0.6 $\mu m$ thick. By comparison, films of the terpolymer developed with either Riston II Developer or Riston II Developer in the combinations with 2-methoxyethylacetate given in Table II were free of cracking at a thickness of 1.4 $\mu m$.

EXAMPLE 8

Films formed from the unfractionated terpolymer of Example 1 and the corresponding unfractionated copolymer were developed according to the procedure of Example 6. Utilizing a developer of 20 ml Riston II Developer and 5 ml 2-methoxyethylacetate and 0.8 $\mu C/cm^2$ exposure, the unfractionated terpolymer demonstrated at time latitude of 1 to 6 minutes and a temperature latitude of 23° to 28°. Under similar conditions, utilizing the developer of Example 6, the copolymer demonstrated time latitude of less than 30 seconds and temperature latitude of one degree. Thus, while the superiority of the terpolymer is constant under all conditions tested, it is apparent that the fractionated material performs better in both the copolymer and the terpolymer.

I claim:

1. A method of forming a patterned layer on a substrate comprising:

(a) coating said substrate with a composition comprised of a terpolymer of a monomer component and sulfur dioxide in a 1:1 molar ratio, said monomer component being comprised of from about 70 to about 93 mole percent 3-methylcyclopentene and from about 7 to about 30 mole percent 3-cyclopentene-1-acetic acid, said terpolymer having a molecular weight of from about 250,000 to about 1,000,000 and a molecular weight distribution of less than 4, and a suitable solvent therefor;

(b) drying said coating to form an aqueous developable recording medium;

(c) exposing selected portions of said medium to electron beam irradiation; and (d) developing the exposed portions of said medium with an aqueous alkaline developer.

2. A method in accordance with claim 1, wherein said development exposes corresponding portions of the substrate, 3. A method in accordance with claim 2, additionally including etching the exposed substrate with a suitable etchant.

4. A method in accordance with claim 3, wherein said substrate is chrome coated on glass.

5. The method in accordance with claim 1, wherein said composition contains from about 4 percent by weight to about 10 percent by weight of said terpolymer.

6. The method in accordance with claim 5, wherein said composition contains from about 6 percent by weight to about 8 percent by weight of said terpolymer.

7. The method in accordance with claim 1, wherein said solvent is 2-methoxyethylacetate or cyclopentanone.

8. The method in accordance with claim 7, wherein said solvent is 2-methoxyethylacetate.

* * * * *